United States Patent
Kliman et al.

(10) Patent No.: US 6,335,631 B2
(45) Date of Patent: *Jan. 1, 2002

(54) INDUCTION MACHINE ASYMMETRY DETECTION INSTRUMENT AND METHOD

(75) Inventors: Gerald Burt Kliman; James Patrick Lyons, both of Niskayuna, NY (US); John Leonard Oldenkamp, Ft. Wayne, IN (US)

(73) Assignee: General Electric Company, Schenectady, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/207,018

(22) Filed: Dec. 7, 1998

(51) Int. Cl.$^7$ .............................. G01R 31/34; H02P 9/00
(52) U.S. Cl. .......................................... 324/772; 322/44
(58) Field of Search ................................ 324/772, 545; 318/490; 322/44, 28, 59

(56) References Cited

U.S. PATENT DOCUMENTS

| | | |
|---|---|---|
| 3,875,511 A | 4/1975 | Sims |
| 4,761,703 A | 8/1988 | Kliman et al. |
| 4,808,932 A | 2/1989 | Schulz, Jr. et al. |
| 5,739,698 A | * 4/1998 | Bowers et al. .............. 324/772 |

* cited by examiner

Primary Examiner—Safet Metjahic
Assistant Examiner—J. Kerveros

(57) ABSTRACT

An induction machine asymmetry detection instrument includes an interconnector and a voltmeter. The interconnector is configured to connect an electric source across a first terminal and a second terminal of a stator of an induction machine. The induction machine includes a rotor disposed for magnetic coupling with the stator. The interconnector is further configured to cause a flow of direct current between the first terminal and the second terminal of the stator during a rotation of the rotor when the induction machine is substantially unloaded. The voltmeter is connectable across the second terminal and a third terminal of the stator. A detection by the voltmeter of a meaningful voltage across the second terminal and the third terminal of the stator concurrent with the flow of direct current between the first terminal and the second terminal and concurrent with the rotation of the rotor serves to indicate an asymmetry of a portion of the induction machine.

20 Claims, 6 Drawing Sheets

INDUCTION MACHINE ASYMMETRY DETECTION INSTRUMENT AND METHOD

FIELD OF THE INVENTION

This invention relates, generally, to induction machines and, more particularly, to detection of asymmetry of a rotor in an induction machine.

BACKGROUND OF THE INVENTION

Induction machines are valued in commerce and industry because they are relatively simple to build and generally robust. Examples of induction machines include induction motors and induction generators.

In a typical induction motor, a rotor is magnetically coupled with a stator which has windings that conduct alternating current ("AC"). The rotor includes conductive bars which are electrically shorted together by end rings in a configuration commonly referred to as a "squirrel cage." The conductive bars are mounted within magnetically conductive material. Also, the rotor is coupled to a shaft which provides torque as output to a load connected to the shaft.

Typically, three phase AC current is applied to the windings of the stator. The AC current applied to the windings of the stator induces current in the conductive bars of the rotor. The current induced in the conductive bars of the rotor interacts with a magnetic flux induced by the AC current applied to the windings of the stator to produce torque for a load connected to the shaft and cause the shaft to turn.

An asymmetry in the conductive bars or the end rings generally adversely affects performance of the induction motor by creating a locally increased electrical resistance. For example, a crack or porosity in a conductive bar or an end ring usually leads to undesirable results such as vibration, heating, or torque pulsation.

As described in Sims, U.S. Pat. No. 3,875,511, an early technique for detecting rotor asymmetry faults was to test the rotor prior to assembling the rotor into a stator. To use such a technique to test a motor that has been operational requires disassembly of the rotor from the induction motor to test the rotor in isolation from the stator. A common drawback of disassembly includes time spent in disassembling the rotor from the induction motor for testing and reassembling the rotor in the induction motor following the testing.

As described in Kliman et al., U.S. Pat. No. 4,761,703, a subsequent technique for detecting a rotor asymmetry or fault required the shaft to be connected to a load which served to provide slip between the rotor and the stator field for measurement of current induced in the conductive bars by usual operation of the induction motor. Such a technique commonly presents a difficulty of requiring mechanical alignment between the shaft and the load. So, the technique typically entails the task of mechanically connecting a load in order to test the induction motor before use. Delaying testing for asymmetry until the induction motor is installed with a final load often causes additional difficulties of downtime or inefficiency.

Accordingly, a need exists for a test for an asymmetry in an induction machine while the induction machine is assembled and without requiring connection of a mechanical load. A further need exists for the test to increase convenience, simplicity, and accuracy of asymmetry detection.

SUMMARY OF THE INVENTION

An induction machine asymmetry detection instrument includes an interconnector and a voltmeter. The interconnector is configured to connect an electric source across a first terminal and a second terminal of a stator of an induction machine. The induction machine includes a rotor disposed for magnetic coupling with the stator. The interconnector is further configured to cause a flow of direct current between the first terminal and the second terminal of the stator during a rotation of the rotor when the induction machine is substantially unloaded. The voltmeter is connectable across the second terminal and a third terminal of the stator. A detection by the voltmeter of a meaningful voltage across the second terminal and the third terminal of the stator concurrent with the flow of direct current between the first terminal and the second terminal and concurrent with the rotation of the rotor serves to indicate an asymmetry of a portion of the induction machine.

An induction machine asymmetry detection method includes controlling a flow of direct current between a first terminal and a second terminal of a stator of an induction machine during a rotation of a rotor of the induction machine when the induction machine is substantially unloaded. A voltage is measured across the second terminal and a third terminal of the stator concurrent with the flow of direct current between the first terminal and the second terminal and concurrent with the rotation of the rotor to determine the presence of an asymmetry of a portion of the induction machine.

DETAILED DESCRIPTION

Figure 1:
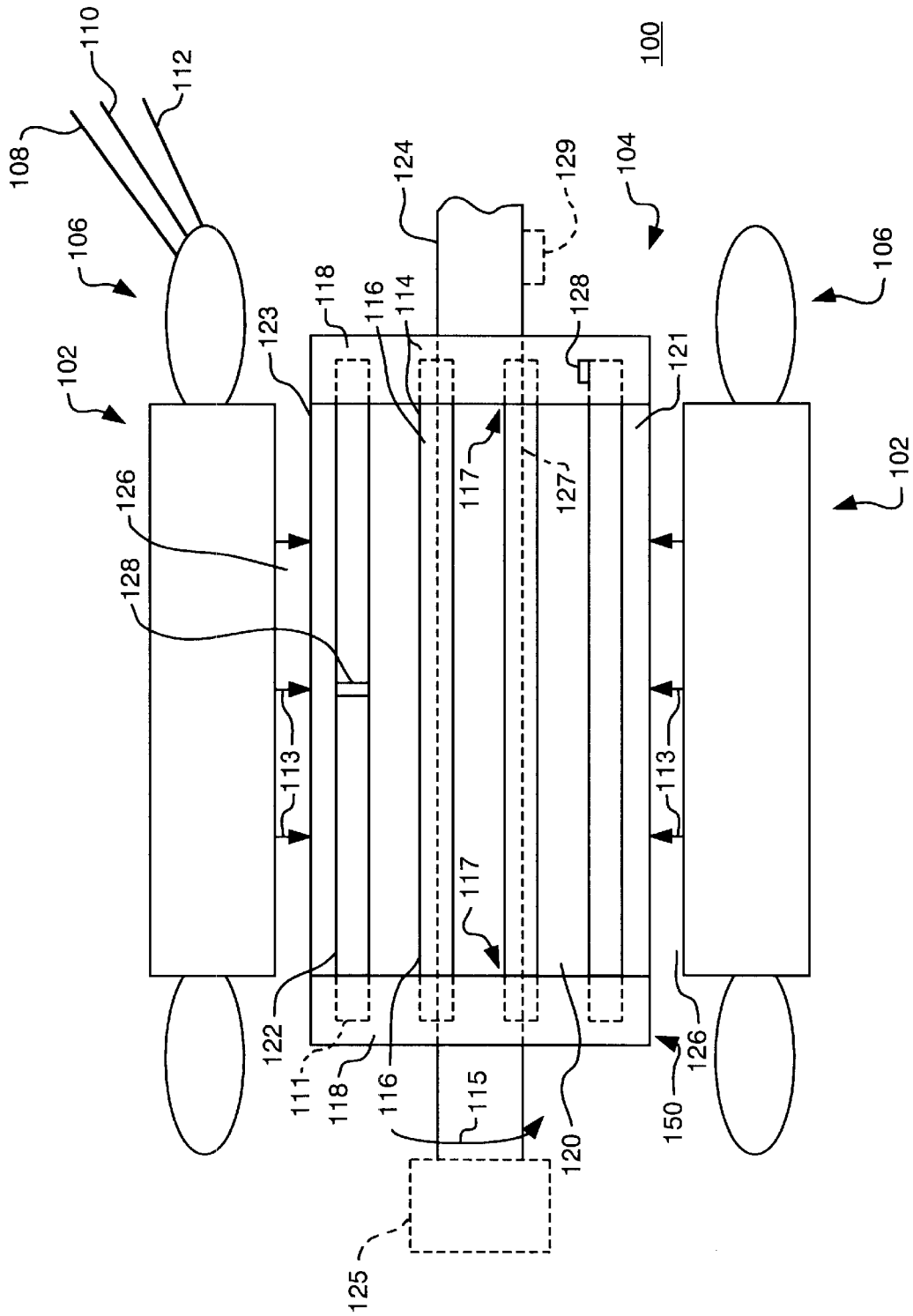
FIG. 1 is a cutaway, sectional, partial, side representation of one example of an induction machine symbolically illustrating exemplary asymmetries.
Figure 2:
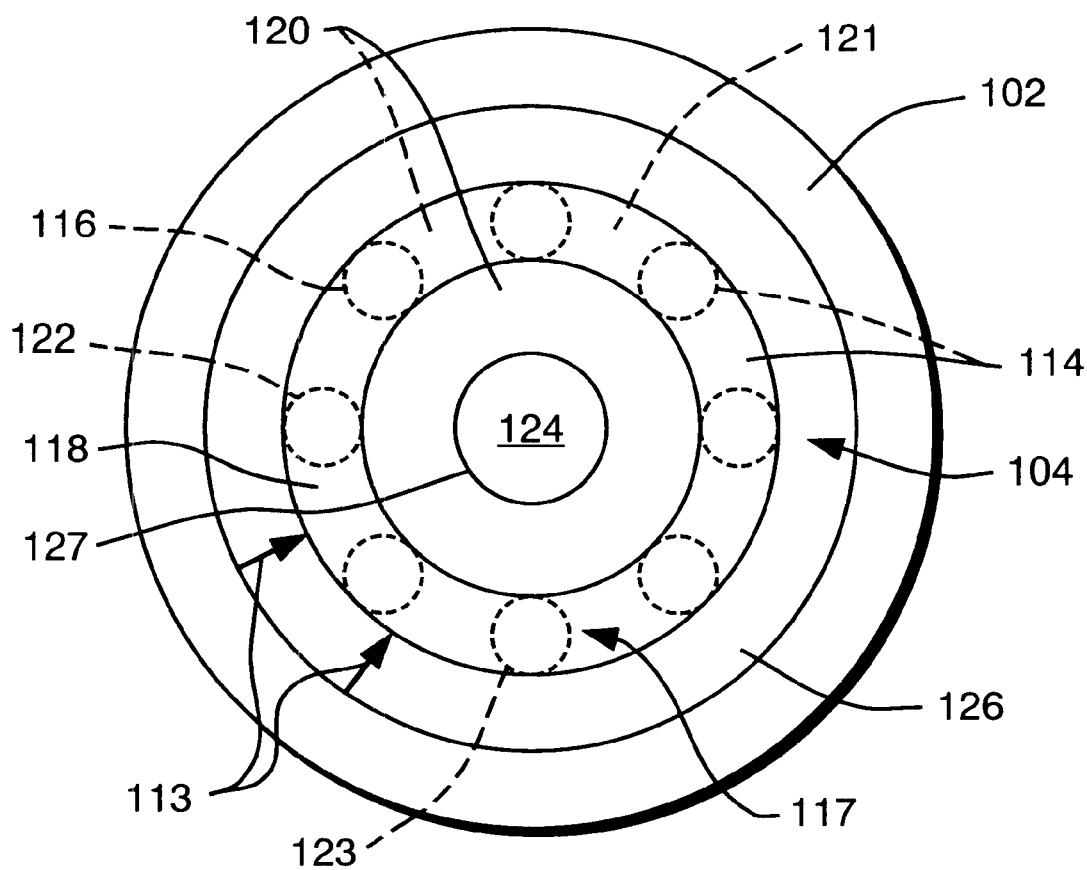
FIG. 2 is a cutaway, partial, end representation of the induction machine of FIG. 1.

Referring to FIGS. 1–2, induction machine 100 includes a stator 102 and a rotor 104. Exemplary embodiments of induction machine 100 include an induction generator, an axially aligned induction motor, and a concentrically aligned induction motor. For explanatory purposes, the description herein emphasizes an embodiment of induction machine 100 as a concentrically aligned induction motor.

Stator 102 includes a number of conductive windings 106. Windings 106 include a first terminal 108, a second terminal 110, and a third terminal 112. Typically, a phased alternating current ("AC") is applied to terminals 108, 110, and 112 in order to generate a magnetic flux 113 passing through a clearance gap 126 between stator 102 and rotor 104 for magnetic coupling thereof, as will be understood by those skilled in the art.

In one example, an AC current of 60 Hz is applied to each one of terminals 108, 110, and 112, with a phase difference of 120° with respect to an AC current applied to each other one of terminals 108, 110, and 112. So, magnetic flux 113 can be generated with a peak rotating at, for instance, a synchronous frequency (e.g., 60 Hz). Magnetic flux 113 serves to induce a voltage in rotor 104 which results in a torque 115, as described herein.

Rotor 104 includes a number of electrical conductors 114. Examples of electrical conductors 114 include a plurality of conductive bars 116 and a plurality of end rings 118. Conductive bars 116 are mounted in, or supported by, magnetic conductor 120.

Conductive bars 116 extend longitudinally in a substantially parallel and generally cylindrical arrangement. Each end 111 of conductive bars 116 usually has a connection 117 to end ring 118. Such a configuration of conductive bars 116 electrically shorted together by connections 117 to end rings 118 is often referred to as a "cage" 150.

In one embodiment, conductive bars 116 are preformed bars of copper or aluminum, or alloys thereof (e.g., brass or bronze). Conductive bars 116 are often disposed in a number of slots 122 located about a circumference 121 (FIG. 2) of magnetic conductor 120. Magnetic conductor 120, in one example, is formed with a material such as steel. Conductive bars 116 can be exposed at an exterior surface 123 of rotor 104, or can be covered by magnetic conductor 120. In another embodiment, conductive bars 116 are cast into slots 122.

Magnetic conductor 120 is formed, for example, as an integral member or as a series of circular laminations having holes aligned thereamong to form slots 122, and an opening 127 for receiving a shaft 124. Magnetic conductor 120 is typically disposed about and fastened to shaft 124. Shaft 124 can be connected to a mechanical load 125 in order to transmit torque 115 from induction machine 100.

Rotor 104 and shaft 124 are coaxially aligned with stator 102. Operation of induction machine 100 causes rotor 104 and shaft 124 to rotate within clearance gap 126 and stator 102.

In one example, magnetic flux 113 generated from stator 102 and passing through magnetic conductor 120 serves to induce voltage in conductive bars 116. Since conductive bars 116 are electrically shorted together at ends 111 by end rings 118, a current flows in conductive bars 116 and end rings 118. This current induced in electrical conductors 114, that is, the current induced in conductive bars 116 and end rings 118, interacts with magnetic flux 113 passing through clearance gap 126 and magnetic conductor 120 to produce torque 115 to turn or spin rotor 104 and shaft 124.

Performance of induction machine 100 can suffer when any portion of the induction machine has, includes, or exhibits an asymmetry 128, symbolically represented in FIG. 1. The asymmetrical portion can be present, for example, in any of the electrical conductors 114 (e.g., any of the conductive bars 116 or the end rings 118), in magnetic conductor 120, or in a bearing 129.

For instance, asymmetry 128 can include a break anywhere along conductive bar 116, a break anywhere in end ring 118, or a poor joint at connection 117 between a conductive bar 116 and an end ring 118. Further illustrative examples of asymmetry 128 include a defect, crack, fault, failure, compromise, misalignment, unbalance, unsteadiness, misfit, material mismatch, or porosity of electrical conductor 114. In another example, asymmetry 128 includes a magnetic anisotropy of magnetic conductor 120.

In another example, asymmetry 128 can also result from a looseness of bearing 129 (FIG. 1) causing a whirling of rotor 104, as will be understood by those skilled in the art. In another example, asymmetry 128 results from a material mismatch such as when an assembler mistakenly installs a first conductive bar 116 formed from one material (e.g., bronze) into rotor 104 having therein a second conductive bar 116 formed from another material (e.g., brass). In this example, asymmetry 128 causes a disadvantageous non-uniformity in electrical resistance of electrical conductor 114 of rotor 104. The non-uniformity in electrical resistance (as a form of asymmetry 128 of any of the electrical conductors 114 relative to cage 150) undesirably degrades operation of induction machine 100.

The following expression has been determined in a development of an exemplary configuration for detection of asymmetry 128 of any of the electrical conductors 114 relative to cage 150.

$$Vls = A1 \cdot \left(\frac{\Delta R2}{R2ave}\right) \cdot I1 \cdot R2ave \cdot \left(\frac{Xm}{Xm + X2}\right)^2 \cdot \sin(2 \cdot \omega_s \cdot t)$$

The above expression is employed in, or relates to, a number of illustrative configurations for detection of asymmetry 128 of any of the electrical conductors 114 relative to cage 150, as described herein with reference to FIGS. 3–6.

Figure 6:
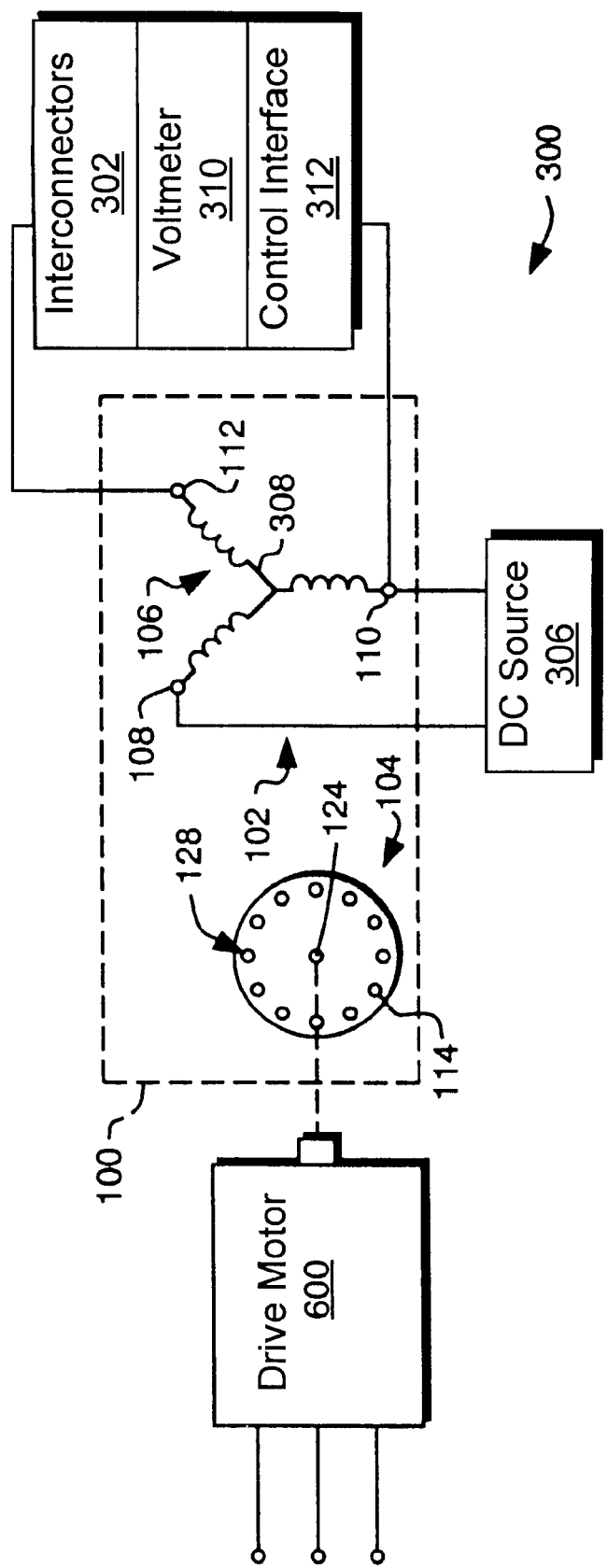
FIG. 6 is a partial, schematic representation of a further example of a configuration for an instrument providing exemplary detection of an asymmetry of the induction machine of FIG. 1.

In the above expression, Vls is the voltage measured across any available pair of terminals 108, 110, and 112, and t represents time. A1 is a constant whose value depends upon the configuration for windings 106. The value of A1 is 2 for a wye (Y) connection 308 (FIG. 3) of windings 106. The value of A1 is ⅔ for a delta (Δ) connection (not shown) of windings 106. Wye and delta connections of windings 106 are known in the art. While wye connection 308 is depicted in FIGS. 3–4 and 6, an alternative embodiment could employ a delta connection (not shown).

R2 represents the resistance of rotor 104. ΔR2, which is determined from a solution of the above expression, is an average difference in a perceived resistance R2 that is seen as the voltage is measured for rotating rotor 104 ((R2 maximum−R2 minimum)2). When there is no asymmetry, then resistance R2 does not change and ΔR2 is equal to zero.

Furthermore, a magnitude of ΔR2 varies proportionally with a degree of asymmetry 128. For example, a relatively larger ΔR2 corresponds to an increased asymmetry 128. Limits or bounds can be selected within which ΔR2 is an acceptable deviation from zero for evaluation of problems of rotor 104 of induction machine 100. In the expression above, R2ave is an average electrical resistance of rotor 104 (that is, one half of the sum of the minimum and the maximum resistance of R2). I1 is a direct current applied across any available pair of terminals 108, 110, and 112. Xm is a magnetizing reactance of rotor 104. X2 is a leakage reactance of rotor 104. R2ave, Xm, and X2 have values that can either be prespecified by the design of rotor 104 or calculated by conventional techniques. ωs is an electrical frequency, in radians per second, or speed of the rotor, in radians per second, times the number of pole pairs of the motor. In one example, ωs is determined by measuring a frequency of rotation of shaft 124 connected to rotor 104. Because the voltage is proportional to the resistance, the voltage itself can serve as an indicator of asymmetry either by itself or by being used by a computer to determine ΔR2 using the above equation, for example.

Figure 3:
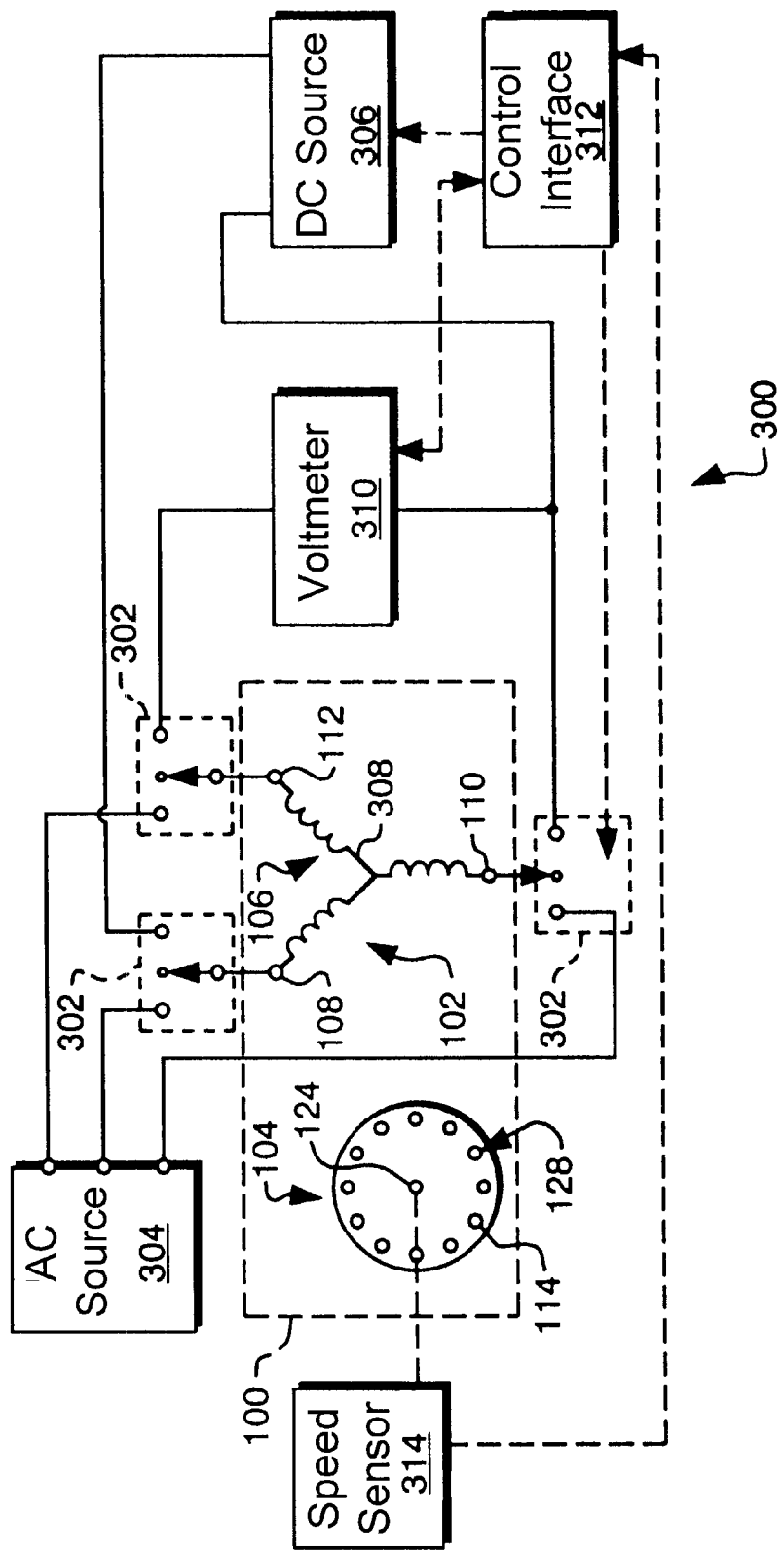
FIG. 3 is a partial, schematic representation of one example of a configuration for an instrument providing exemplary detection of an asymmetry of the induction machine of FIG. 1.
Figure 4:
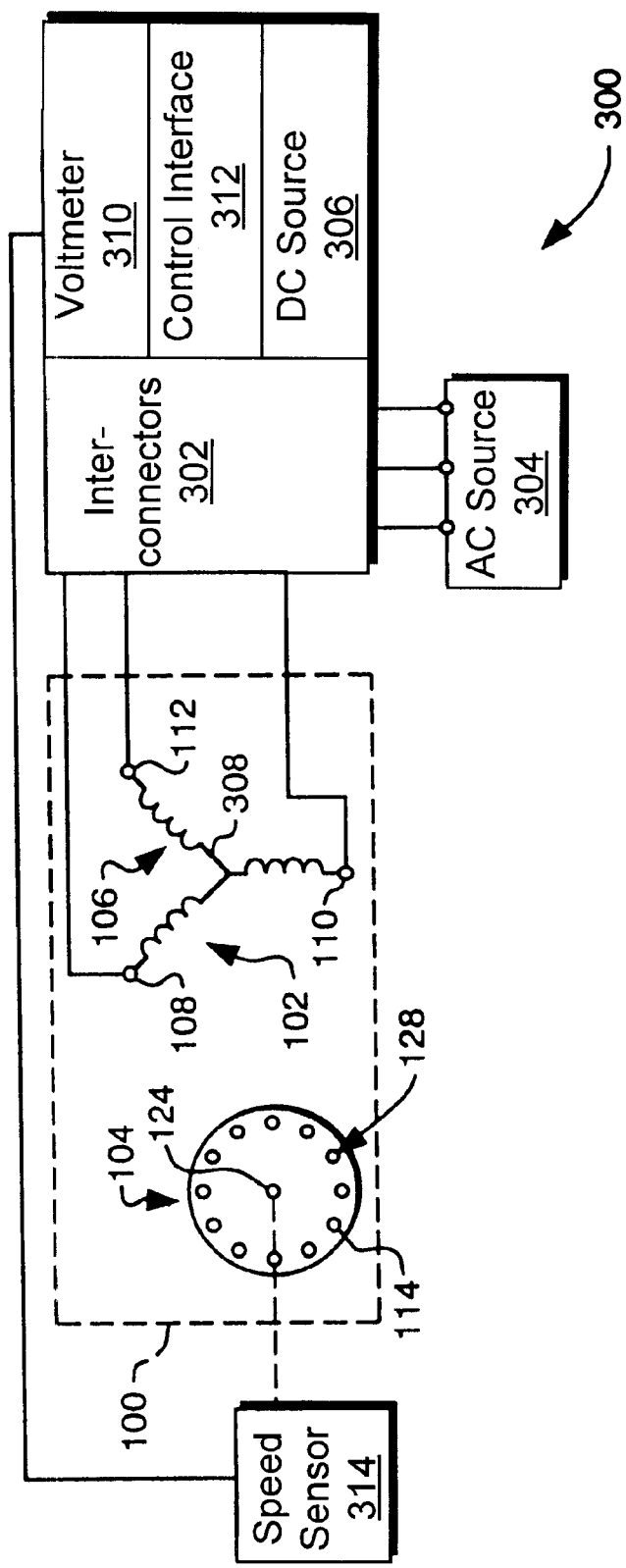
FIG. 4 is a partial, schematic representation of another example of a configuration for an instrument capable of providing a number of features of the configuration of FIG. 3.

Turning to FIGS. 3–4, instrument 300 includes one or more interconnectors 302 configured to connect one or more electric sources 304 and 306 across a number of terminals 108, 110, and 112 of stator 104 of induction machine 100. In one example, induction machine 100 is a three phase system using wye (Y) connection 308. Interconnectors 302 comprise, for example, at least one switch unit.

Instrument 300 includes a voltmeter 310 connectable across a number of terminals 108, 110, and 112. In one example, instrument 300 is configured to connect electric source 306 across first and second terminals 108 and 110, and connect voltmeter 310 across second and third terminals 110 and 112. Voltmeter 310 serves to measure a potential difference across first and third terminals 110 and 112. In one example, voltmeter 310 is a spectrum analyzer. Alternatively, voltmeter 310 is connectable across terminals 108 and 112.

In a further example, represented in FIG. 4 and by dashed connection paths in FIG. 3, instrument 300 includes an optional control interface 312 coupled to interconnectors 302, electric source 306, voltmeter 310, and a speed sensor 314. Control interface 312 includes, for instance, a computer having a user input device and a display. In this example, optional speed sensor 314 is configured to sense rotation (e.g., speed or frequency) of rotor 104 or shaft 124. For is example, speed sensor 314 may comprise a tachometer. For illustrative purposes, FIG. 4 depicts a relatively compact arrangement among interconnectors 302, control interface 312, voltmeter 310, and electric source 306.

Exemplary operation of instrument 300 is now described. Control interface 312 controls interconnectors 302 and apply a three phase AC current from electric source 304 to terminals 108, 110, and 112, in order to cause rotor 104 to obtain a substantially constant rotation (e.g., speed or frequency). Shaft 124 is unloaded or substantially unloaded. Although shaft 124 experiences friction through bearing 129 (FIG. 1) and rotor 104 experiences air resistance, load 125 is not connected to shaft 124. Advantageously, this substantial unloading of rotor 104 avoids any need for a task of mechanical alignment and attachment between load 125 and shaft 124.

Next, control interface 312 directs interconnectors 302 to disconnect electric source 304 from terminals 108, 110, and 112, and a substantially constant rotation of rotor 104 continues (e.g., because of inertia of rotor 104 and relatively low windage and friction between bearing 129, FIG. 1, and shaft 124).

Control interface 312 waits momentarily for electromagnetic transients of rotor 104 to decay or die out, and then controls interconnectors 302 to connect a direct current ("DC") from electric source 306, across a pair of terminals (shown as first and second terminals 108 and 110). Although the direct current supplied from source 306 creates a small drag on the rotor, substantially constant rotation continues to occur.

While the DC current source is connected across terminals 108 and 110 and rotor 104 has a substantially constant rotation (that is, constant except for deceleration due to friction and/or air resistance), control interface 312 causes interconnectors 302 to connect voltmeter 310 across a different pair of terminals (shown as second and third terminals 110 and 112). A measurement by voltmeter 310 of a zero voltage across terminals 110 and 112, concurrent with DC current applied across terminals 108 and 110 as well as substantially constant rotation of rotor 104, indicates a lack of asymmetry 128 of rotor 104. In practice, background interference will be detected by the voltmeter. The level of voltage which is considered negligible (not meaningful) will depend on the particular application, the smallest measurable ΔR2, the background interference, and the rate of deceleration (due to friction, air resistance, and/or drag).

A detection of a meaningful voltage across terminals 110 and 112 while DC current is applied across terminals 108 and 110 and during rotation of rotor 104 at a substantially constant speed indicates a presence of asymmetry 128 of electrical conductor 114 relative to cage 150. Further, a magnitude of voltage measured by voltmeter 310 across terminals 110 and 112 while DC current is applied across terminals 108 and 110 concurrent with substantially constant rotation of rotor 104 is proportional to a degree of asymmetry 128 of electrical conductor 114 relative to cage 150.

Figure 5:
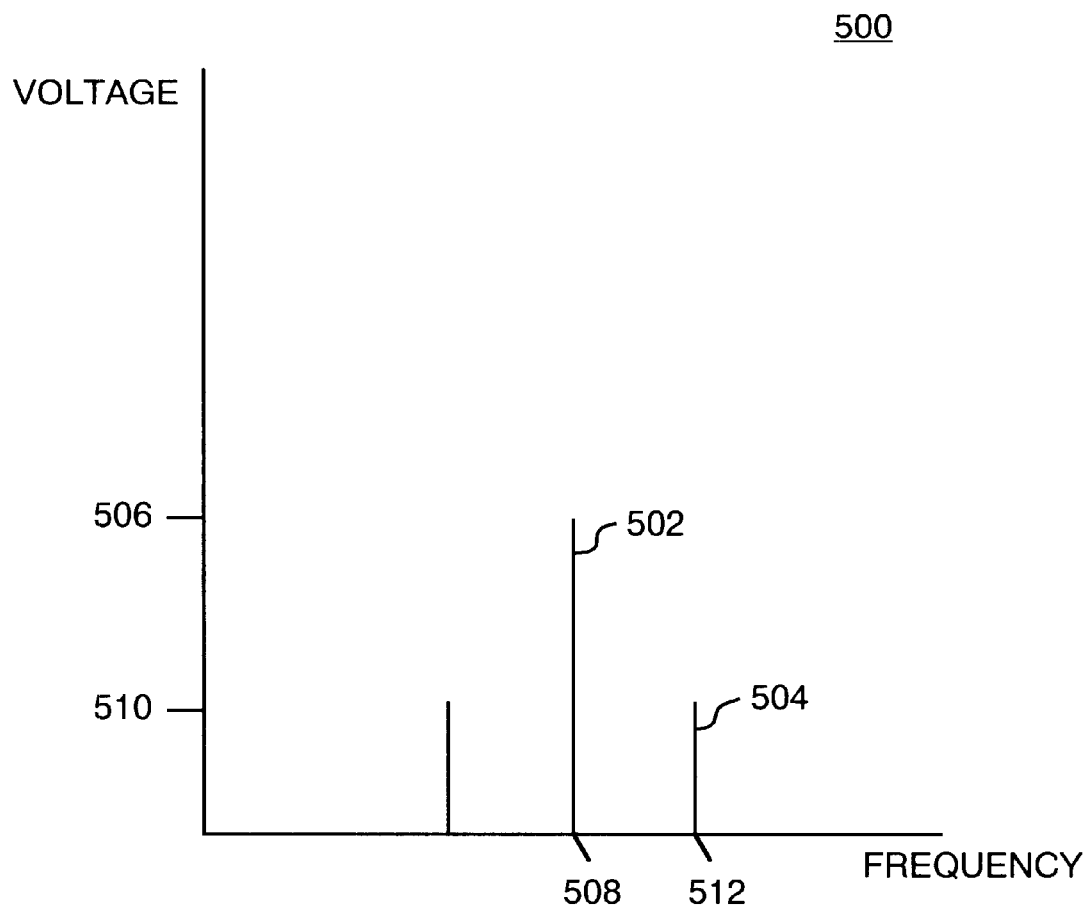
FIG. 5 is one example of a graph of voltage versus frequency illustrating exemplary discrimination among voltages measured for a rotor of the induction machine of FIG. 1.

Now referring to FIGS. 3–5, in one example, voltmeter 310 is a spectrum analyzer allowing measurement of voltage across terminals 110 and 112 at one or more frequencies. For instance, speed sensor 314 measures a speed of rotation of shaft 124, and control interface 312 cooperates with voltmeter 310 to measure voltage at twice the speed of rotation of shaft 124 multiplied by the number of pole pairs of the motor. For example, in one embodiment, voltmeter 310 is a spectrum analyzer coupled with control interface 312 which detects an exemplary voltage measurement 506 at a specific frequency 508 (see plot 502 and plot 504 of graph 500). The non-zero value for exemplary voltage measurement 506 at specific frequency 508 determined for rotor 104 of induction machine 100 indicates an existence of asymmetry 128. A detection of an additional voltage measurement 510 at a non-targeted frequency 512 is interpreted as noise, and not indicative of an existence of asymmetry 128. Instrument 300 can omit speed sensor 314 and interpret any voltage measurement by voltmeter 310 as indicative of an existence of asymmetry 128, such as where there is little or no expectation of noise.

Referring to FIG. 6, in another example, instrument 300 includes interconnector 302 coupled to voltmeter 310 coupled to control interface 312, all connectable across terminals 110 and 112. Control interface 312 is coupled to electric source 306. Electric source 306 is coupled across terminals 108 and 110. An exemplary operation of these components can proceed as described above with reference to FIGS. 3–5, with the following modification. A drive unit 600 is connectable to shaft 124 to provide the substantially constant rotation of rotor 104, as discussed above. For instance, drive unit 600 is a drive motor. Shaft 124 and rotor 104 serve as a load for drive unit 600 (i.e., drive unit 600 is driving, not loading, shaft 124), so shaft 124 and rotor 104 are substantially unloaded as described herein.

Various embodiments of instrument 300 allow evaluation of an existence of asymmetry 128 as part of tests typically performed on induction machine 100 before final installation, such as at a plant of a manufacturer or at an intermediate location (e.g., during shipment or delivery).

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An induction machine asymmetry detection instrument, comprising:
   an interconnector configured to connect an electric source across a first terminal and a second terminal of a stator of an induction machine, the induction machine including a rotor disposed for magnetic coupling with the stator, the interconnector further configured to cause a flow of direct current between the first terminal and the second terminal during a rotation of the rotor when the induction machine is unloaded and rotating freely;

a voltmeter connectable across the second terminal and a third terminal of the stator for measuring voltage across the second terminal and the third terminal concurrent with the flow of direct current and the rotation of the rotor; and a control interface for determining the presence of an asymmetry of a portion of the induction machine using the measured voltage.

2. The instrument of claim 1, wherein the rotation of the rotor is at a substantially constant speed.

3. The instrument of claim 1, wherein the rotor is connected with a shaft, the shaft being unloaded during the rotation of the rotor.

4. The instrument of claim 3, further comprising a speed sensor coupled with at least one of the rotor and the shaft.

5. The instrument of claim 1, wherein the voltmeter comprises a spectrum analyzer.

6. The instrument of claim 5, wherein the spectrum analyzer is configured to perform the detection of the voltage at substantially twice a frequency of the rotation of the rotor multiplied by a number of pole pairs of the induction machine.

7. The instrument of claim 1, wherein the portion comprises at least one of an electrical conductor portion, a magnetic conductor portion, and a bearing portion, and wherein the asymmetry comprises at least one of a defect, crack, break, fault, failure, compromise, misalignment, unbalance, unsteadiness, misfit, material mismatch, and porosity of the electrical conductor portion, a magnetic anisotropy of the magnetic conductor portion, and at least one of a looseness and a whirling of the bearing portion.

8. The instrument of claim 1, wherein the portion comprises at least one of a rotor bar and a rotor end ring.

9. The instrument of claim 1, in combination with a drive motor coupled with the rotor for driving the rotation of the rotor.

10. The instrument of claim 1, further including a phased alternating current source for providing phased alternating current through the interconnector among the first, second, and third terminals to produce the rotation of the rotor, the interconnector configured to disconnect the phased alternating current source prior to connecting the electric source across the first and second terminals.

11. The instrument of claim 1, wherein the control interface comprises a computer for using the measured voltage to estimate a difference between the maximum and minimum resistance of the rotor and for using the estimated difference to determine the presence of the asymmetry.

12. An induction machine asymmetry detection method, comprising:

using an electric source to provide a flow of direct current between a first terminal and a second terminal of a stator of an induction machine during a rotation of a rotor of the induction machine when the induction machine is unloaded and rotating freely;

measuring a voltage across the second terminal and a third terminal of the stator concurrent with the flow of direct current and the rotation of the rotor; and determining the presence of an asymmetry of a portion of the induction machine using the measured voltage.

13. The method of claim 12, wherein the determining occurs at substantially twice a frequency of the rotation of the rotor multiplied by a number of pole pairs of the induction machine.

14. The method of claim 13, further comprising sensing the frequency of rotation of at least one of the rotor and the shaft.

15. The method of claim 12, wherein the rotation of the rotor comprises a second rotation of the rotor, and further comprising controlling a flow of phased alternating current among the first terminal, the second terminal, and the third terminal to motivate a first rotation of the rotor, the flow of direct current occurring after the flow of phased alternating current, the first rotation of the rotor resulting in the second rotation of the rotor.

16. The method of claim 12, further including using a drive motor to create the rotation of the rotor.

17. The method of claim 12, wherein determining includes using the measured voltage to estimate a difference between the maximum and minimum resistance of the rotor.

18. An induction machine asymmetry detection instrument, comprising:

an interconnector configured to connect an electric source across a first terminal and a second terminal of a stator of an induction machine, the induction machine including a rotor disposed for magnetic coupling with the stator, the interconnector further configured to cause a flow of direct current between the first terminal and the second terminal during a rotation of the rotor when the induction machine is unloaded and rotating freely; and a voltmeter connectable across the second terminal and a third terminal of the stator, wherein a detection by the voltmeter of a voltage greater than background interference across the second terminal and the third terminal concurrent with the flow of direct current and the rotation of the rotor serves to indicate an asymmetry of a portion of the induction machine.

19. The instrument of claim 18, wherein the rotation of the rotor is at a speed that is constant except for deceleration due to friction and air resistance.

20. The instrument of claim 18, further including a phased alternating current source for providing phased alternating current through the interconnector among the first, second, and third terminals to produce the rotation of the rotor, the interconnector configured to disconnect the phased alternating current source prior to connecting the electric source across the first and second terminals.

* * * * *